(12) United States Patent
Ueda et al.

(10) Patent No.: US 7,081,778 B2
(45) Date of Patent: *Jul. 25, 2006

(54) SEMICONDUCTOR INTEGRATED CIRCUIT RELATED TO A CIRCUIT OPERATING ON THE BASIS OF A CLOCK SIGNAL

(75) Inventors: Yoshitaka Ueda, Ogaki (JP); Isao Ogura, Ogaki (JP)

(73) Assignee: Sanyo Electric Co., Ltd., Osaka-fu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/760,475

(22) Filed: Jan. 21, 2004

(65) Prior Publication Data

US 2004/0150442 A1 Aug. 5, 2004

Related U.S. Application Data

(63) Continuation of application No. 09/745,990, filed on Dec. 26, 2000, now Pat. No. 6,707,328.

(30) Foreign Application Priority Data

Dec. 28, 1999 (JP) .................................. 11-372781

(51) Int. Cl.
H03L 7/00 (2006.01)
(52) U.S. Cl. ...................... 327/141; 327/143; 327/166; 327/565
(58) Field of Classification Search ................ None
See application file for complete search history.

(56) References Cited

U.S. PATENT DOCUMENTS

| 4,988,893 A | 1/1991 | Bonneau et al. ............. 307/279 |
| 5,124,796 A | 6/1992 | Maki ..................... 358/213.11 |
| 5,289,518 A | 2/1994 | Nakao .......................... 377/81 |
| 5,296,757 A | 3/1994 | Koizumi ..................... 307/443 |
| 5,382,846 A | 1/1995 | Shigehara et al. ............ 326/68 |
| 5,576,643 A | 11/1996 | Kobayashi et al. ........... 326/94 |
| 5,923,187 A | 7/1999 | Maugars ...................... 326/86 |
| 5,990,706 A | 11/1999 | Matsumoto et al. .......... 326/98 |

(Continued)

FOREIGN PATENT DOCUMENTS

JP 61002342 A 1/1986

(Continued)

OTHER PUBLICATIONS

Japanese Notification of Reason(s) for Refusal (Oct. 29, 2002) with translation.

(Continued)

*Primary Examiner*—Kenneth B. Wells
*Assistant Examiner*—An T. Luu
(74) *Attorney, Agent, or Firm*—Westerman, Hattori, Daniels & Adrian LLP

(57) ABSTRACT

A semiconductor integrated circuit comprises therein a plurality of logic circuits synchronously designed to operate in synchronization with a clock signal, a first power supply wire for supplying a high-potential side power supply voltage from a first input terminal to each logic circuit, a second power supply wire for supplying the high-potential side power supply voltage from a second input terminal to each logic circuit and a third power supply wire for supplying the high-potential side power supply voltage from a third input terminal to each logic circuit. The logic circuit (DFF circuit) includes two stages of latch circuits and a clock signal inversion circuit. Only the clock signal inversion circuit is connected with the first power supply wire, while the second power supply wire is connected with the remaining latch circuits.

14 Claims, 7 Drawing Sheets

U.S. PATENT DOCUMENTS 6,380,764 B1    4/2002   Katoh et al. ................... 326/93
6,707,328 B1 *  3/2004   Ueda et al. ................. 327/141

FOREIGN PATENT DOCUMENTS

| | | |
|---|---|---|
| JP | 3-932-37 | 4/1991 |
| JP | 06310656 A | 11/1994 |
| JP | 8-125025 | 5/1996 |
| JP | 11-204649 | 7/1999 |

OTHER PUBLICATIONS

Notification of Reasons for Refusal dated Aug. 19, 2003 from the Japanese Patent Office for Japanese Laid Open Patent Application No. 11-372781 with translation.

* cited by examiner

F I G. 1
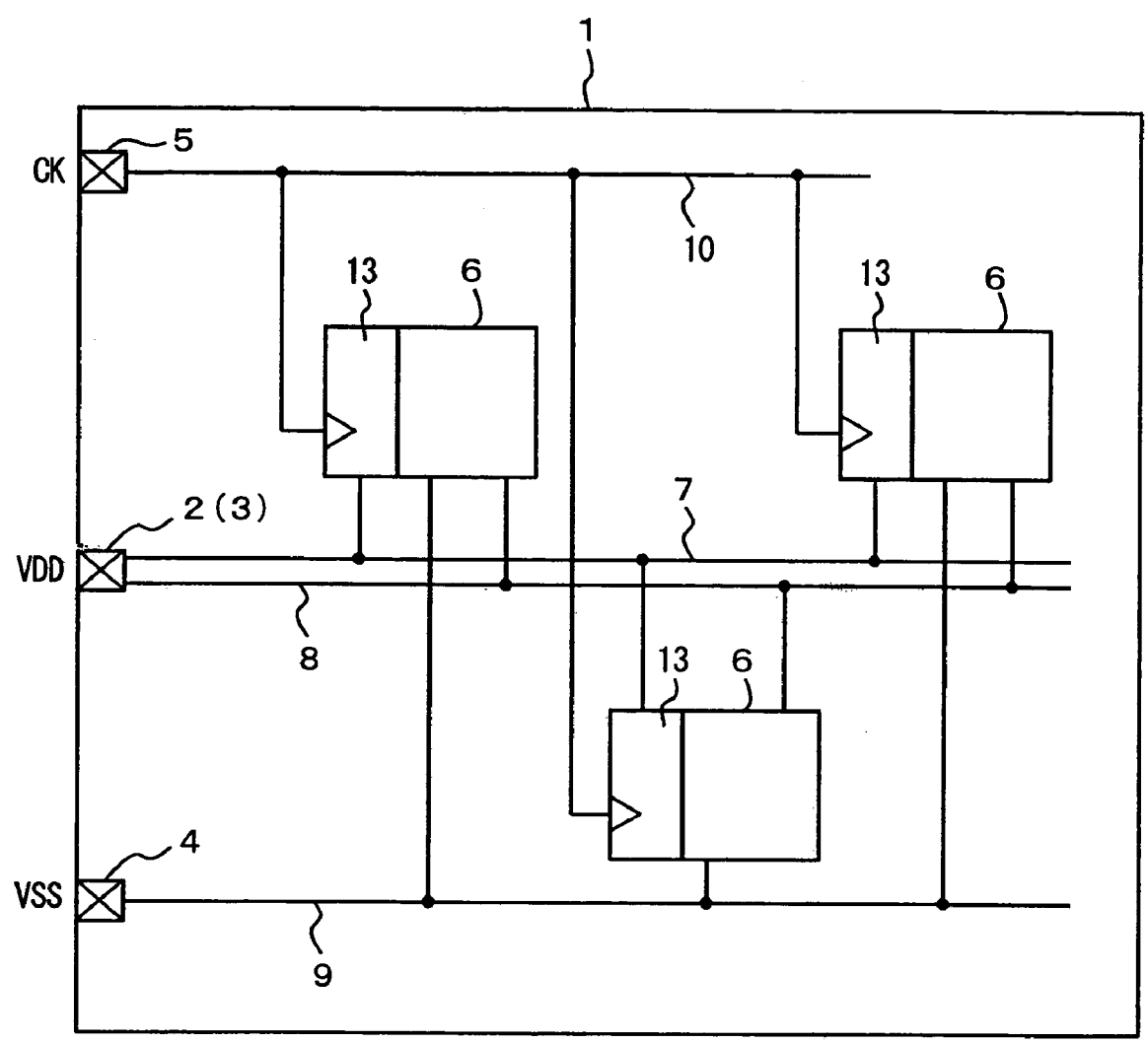

F I G. 7
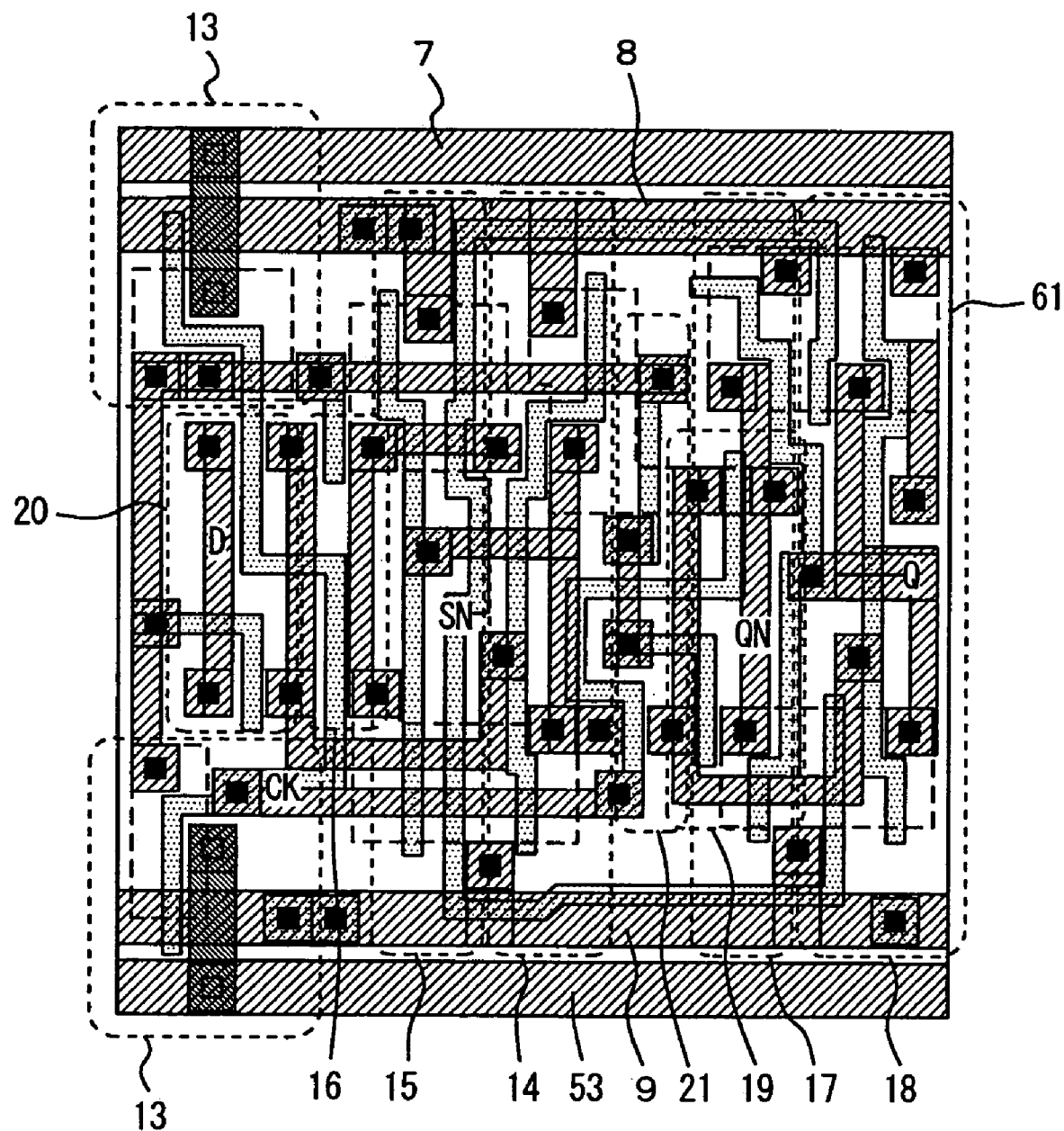

SEMICONDUCTOR INTEGRATED CIRCUIT RELATED TO A CIRCUIT OPERATING ON THE BASIS OF A CLOCK SIGNAL

This application is a divisional of prior application Ser. No. 09/745,990, filed on Dec. 26, 2000 now U.S. Pat. No. 6,707,328.

BACKGROUND OF THE INVENTION

1. Field of the Invention

The present invention relates to a semiconductor integrated circuit, and more particularly, it relates to a circuit operating on the basis of a clock signal.

2. Description of the Prior Art

In relation to an ASIC (application specific integrated circuit) readily implementing a device for a specific application with CAD (computer aided design), a gate array system, a standard cell system and an embedded array system are well known in general as methods of efficiently designing a semi-custom LSI.

In the gate array system, basic cells covered with transistors in the form of arrays are arranged and wired for forming a logic circuit, and the design TAT (turn-around time) is advantageously reduced.

In the standard cell system, optimally designed verified macro cell parts are previously registered in a design database for CAD so that the macro cell parts are arbitrarily combined by CAD. According to this method, large-sized macro cell parts such as a CPU (central processing unit) and a memory are easy to design although the design TAT is longer than that in the gate array system.

In the embedded array system, employing the advantages of both of the gate array system and the standard cell system, macro cell parts of standard cells are embedded in a random logic part of a gate array.

When designing an ASIC, power supply wires are necessary for fixing signal lines in the circuit to a power supply potential or a ground potential. According to Japanese Patent Laying-Open No. 8-125025 (1996), for example, power supply potential wires and ground potential wires are provided in the form of rings for enclosing a microcomputer core as macro cell parts in a design of an ASIC microcomputer.

In a synchronous design for operating a plurality of logic circuits in synchronization with a clock signal, a large current instantaneously flows to power supply wires since the clock signal makes transition an extremely large number of times as compared with other signals and the logic circuits are designed to simultaneously operate due to the synchronous design. Thus, the power supply wires readily cause voltage drops. When the power supply wires cause voltage drops, data signals processed in the logic circuits cause noise, waveform rounding or delay degradation, leading to malfunctions.

SUMMARY OF THE INVENTION

An object of the present invention is to provide a semiconductor integrated circuit capable of suppressing occurrence of a malfunction resulting from fluctuation of a power supply voltage to the minimum.

A semiconductor integrated device according to the present invention comprises a single or plurality of logic circuits each including a first circuit for inputting a clock signal and a second circuit operating in synchronization with the clock signal input by the first circuit, a first power supply wire connected with the first circuit of each logic circuit and a second power supply wire provided independently of the first power supply wire and connected with the second circuit of each logic circuit.

In the semiconductor integrated circuit, the first circuit of each logic circuit is connected with the first power supply wire, and the second circuit of each logic circuit is connected with the second power supply wire provided independently of the first power supply wire. Also when the first power supply wire causes a large voltage drop, therefore, no influence thereof is exerted on the second power supply wire. Therefore, a data signal processed in the first circuit can be prevented from noise, waveform rounding or delay degradation, for preventing a malfunction.

The semiconductor integrated circuit may further comprise a first input terminal for externally supplying a power supply voltage to the first power supply wire and a second input terminal for externally supplying the power supply voltage to the second power supply wire, and the first and second input terminals may be provided in common. In this case, the number of external pins can be reduced.

The semiconductor integrated circuit may further comprise a semiconductor substrate formed with the single or plurality of logic circuits, the first power supply wire and the second power supply wire, and the first and second input terminals may include a bonding pad formed on the semiconductor substrate in common. In this case, voltage drops in the first and second input terminals can be ignored.

The semiconductor integrated circuit may further comprise a first input terminal for externally supplying a power supply voltage to the first power supply wire and a second input terminal for externally supplying the power supply voltage to the second power supply wire, and the first and second input terminals may be provided independently of each other.

When the first power supply wire causes a large voltage drop in this case, the second power supply wire is prevented from bad influence thereof exerted through the first and second input terminals.

The semiconductor integrated circuit may further comprise a semiconductor substrate formed with the single or plurality of logic circuits, the first power supply wire and the second power supply wire, and the first and second input terminals may include bonding pads formed on the semiconductor substrate respectively. In this case, voltage drops in the first and second input terminals can be ignored.

The first power supply wire may have a larger width than the second power supply wire. The width of the second power supply wire is preferably small in consideration of area reduction in the overall circuit. On the other hand, a large current instantaneously flows to the first power supply wire. When the width of the first power supply wire is rendered larger than that of the second power supply wire, wiring resistance of the first power supply wire is so reduced that the value of a voltage drop in the first power supply wire can be reduced.

The power supply voltage may include a high-potential side power supply voltage and a low-potential side power supply voltage, the first power supply wire may include a first high-potential side power supply wire for supplying the high-potential side power supply voltage to the first circuit and the second power supply wire may include a second high-potential side power supply wire for supplying the high-potential side power supply voltage to the second circuit, while the semiconductor integrated circuit may further comprise a common low-potential side power supply wire for supplying the low-potential side power supply voltage to the first circuit and the second circuit.

In this case, the first high-potential side power supply wire is connected with the first circuit, while the second high-potential side power supply wire provided independently of the first high-potential side power supply wire is connected with the second circuit. Also when the first high-potential side power supply wire causes a large voltage drop, therefore, no bad influence is exerted to the second high-potential side power supply wire. Therefore, the second circuit can be prevented from a malfunction.

The semiconductor integrated circuit may further comprise a first high-potential side input terminal for externally supplying the high-potential side power supply voltage to the first high-potential side power supply wire, a second high-potential side input terminal for externally supplying the high-potential side power supply voltage to the second high-potential side power supply wire and a low-potential side input terminal for externally supplying the low-potential side power supply voltage to the common low-potential side power supply wire.

The first high-potential side input terminal and the second high-potential side input terminal may be provided in common. Alternatively, the first high-potential side input terminal and the second high-potential side input terminal may be provided independently of each other.

The first high-potential side power supply wire may have a larger width than the second high-potential side power supply wire. Thus, wiring resistance of the first high-potential side power supply wire instantaneously fed with a large current is so reduced that the value of a voltage drop in the first high-potential side power supply wire can be reduced.

The semiconductor integrated circuit may further comprise a semiconductor substrate and a multilayer structure, provided on the semiconductor substrate, forming the single or plurality of logic circuits, the first power supply wire and the second power supply wire, while the multilayer structure may include first and second layers, the low-potential side power supply wire may be formed on the first layer of the multilayer structure, and the first and second high-potential side power supply wires may be formed on the second layer of the multilayer structure.

The power supply voltage may include a high-potential side power supply voltage and a low-potential side power supply voltage, the first power supply wire may include a first high-potential side power supply wire for supplying the high-potential side power supply voltage to the first circuit and a first low-potential side power supply wire for supplying the low-potential side power supply voltage to the first circuit, and the second power supply wire may include a second high-potential side power supply wire for supplying the high-potential side power supply voltage to the second circuit and a second low-potential side power supply wire for supplying the low-potential side power supply voltage to the second circuit.

In this case, the first high-potential side power supply wire and the first low-potential side power supply wire are connected with the first circuit, while the second high-potential side power supply wire provided independently of the first high-potential side power supply wire and the second low-potential side power supply wire provided independently of the first low-potential side power supply wire are connected with the second wire. Also when the first high-potential side power supply wire or the first low-potential side power supply wire causes a large voltage drop, therefore, no influence thereof is exerted on the second high-potential side power supply wire or the second low-potential side power supply wire. Therefore, the second circuit can be prevented from a malfunction.

The semiconductor integrated circuit may include a first high-potential side input terminal for externally supplying the high-potential side power supply voltage to the first high-potential side power supply wire, a second high-potential side input terminal for externally supplying the high-potential side power supply voltage to the second high-potential side power supply wire, a first low-potential side input terminal for externally supplying the low-potential side power supply voltage to the first low-potential side power supply wire and a second low-potential side input terminal for externally supplying the low-potential side power supply voltage to the second low-potential side power supply wire.

The first high-potential side input terminal and the second high-potential side input terminal may be provided in common. Alternatively, the first high-potential side input terminal and the second high-potential side input terminal may be provided independently of each other. Further, the first low-potential side input terminal and the second low-potential side input terminal may be provided in common. Alternatively, the first low-potential side input terminal and the second low-potential side input terminal may provided independently of each other.

The first high-potential side power supply wire may have a larger width than the second high-potential side power supply wire. Thus, wiring resistance of the first high-potential side power supply wire instantaneously fed with a large current is so reduced that the value of a voltage drop in the first high-potential power supply wire can be reduced.

The first low-potential side power supply wire may have a larger width than the second low-potential side power supply wire. Thus, wiring resistance of the first low-potential side power supply wire instantaneously fed with a large current is so reduced that the value of a voltage drop in the first low-potential power supply wire can be reduced.

The semiconductor integrated circuit may further comprises a semiconductor substrate and a multilayer structure, provided on the semiconductor substrate, forming the single or plurality of logic circuits, the first power supply wire and the second power supply wire, and the first and second high-potential side power supply wires and the first and second low-potential side power supply wires may be formed on the same layer of the multilayer structure.

The second circuit may include a holding circuit holding the state of an input signal in response to the clock signal input by the first circuit.

The logic circuit may be formed by a basic cell of a standard cell system or a gate array system.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram of a semiconductor integrated circuit according to a first embodiment of the present invention;

FIG. 7 is an actual circuit diagram of a delayed flip-flop circuit formed by a standard cell system in a third embodiment of the present invention.

Figure 2:
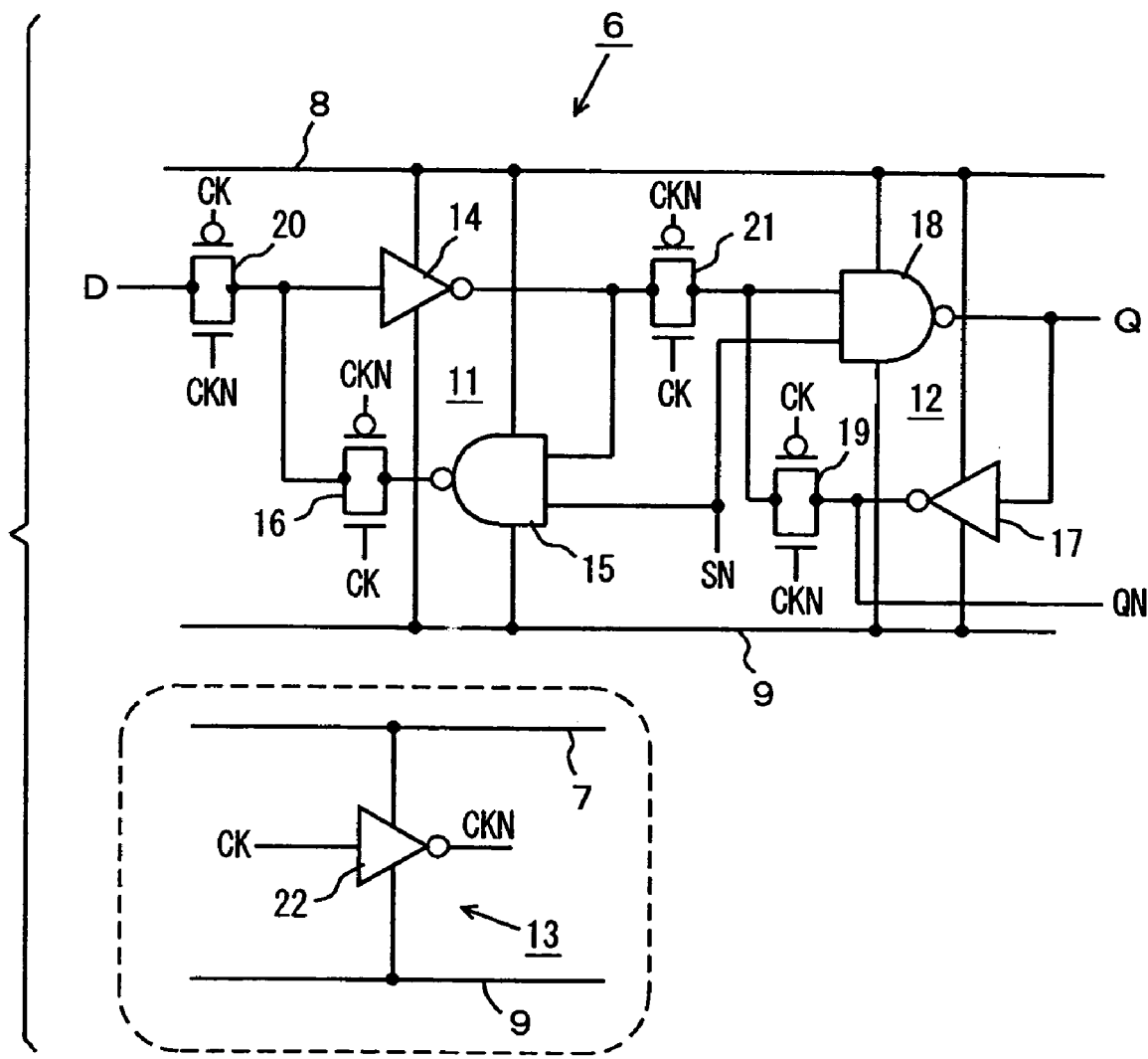
FIG. 2 is a detailed circuit diagram of a logic circuit part in the semiconductor integrated circuit according to the first embodiment of the present invention.

DESCRIPTION OF THE PREFERRED EMBODIMENTS (First Embodiment)

A first embodiment of the present invention is now described with reference to FIGS. 1 to 4.

FIG. 1 is a block circuit diagram schematically showing the overall structure of a semiconductor integrated circuit 1 according to the first embodiment.

Referring to FIG. 1, the semiconductor integrated circuit 1 comprises first and second input terminals 2 and 3 formed on a semiconductor substrate for inputting a power supply voltage VDD from an external power source respectively, a third input terminal 4 for inputting another power supply voltage VSS from another external power source and a clock input terminal 5 for inputting a clock signal CK. In the structure shown in FIG. 1, the first and second input terminals 2 and 3 are provided in common. In other words, the first and second input terminals 2 and 3 are formed by a common bonding pad formed on the semiconductor substrate. The third input terminal 4 and the clock input terminal 5 are formed by bonding pads formed on the semiconductor substrate respectively.

The semiconductor integrated circuit 1 is provided therein with a plurality of logic circuits 6 synchronously designed to operate in synchronization with the clock signal CK, a first power supply wire 7 for supplying the power supply voltage VDD from the first input terminal 2 to a clock signal inversion circuit, described later, of each logic circuit 6, a second power supply wire 8 for supplying the power supply voltage VDD from the second input terminal 3 to each logic circuit 6, a third power supply wire 9 for supplying the power supply voltage VSS from the third input terminal 4 to each logic circuit 6 and a clock input wire 10 for inputting the clock signal CK from the clock input terminal 5 in each logic circuit 6. The semiconductor integrated circuit 1 has a multilayer structure.

Each logic circuit 6 includes a delayed flip-flop circuit (hereinafter referred to as a DFF circuit) shown in FIG. 2, for example. Referring to FIG. 2, the DFF circuit is formed by two stages of latch circuits 11 and 12 and a clock signal inversion circuit 13. The latch circuit 11 is formed by an inverter 14, a NAND circuit 15 and a transfer gate 16. The latch circuit 12 is formed by an inverter 17, a NAND circuit 18 and a transfer gate 19. The final-stage latch circuit 12 outputs a signal Q and an inverted signal QN thereof.

Transfer gates 20 and 21 open/close paths between an input terminal-D and the latch circuit 11 and between the latch circuits 11 and 12 respectively. The transfer gates 16, 19, 20 and 21 are opened/closed by the clock signal CK and an output CKN from the clock signal inversion circuit 13.

The clock signal inversion circuit 13, formed by an inverter 22, outputs the inverted signal CKN of the clock signal CK. The clock signal inversion circuit 13, necessarily operating due to transition of the clock signal CK, corresponds to the first circuit in the present invention. The latch circuits 11 and 12, not operating unless inverted data is input from the input terminal D regardless of transition of the clock signal CK, correspond to the second circuit in the logic circuit of the present invention.

According to the first embodiment, only the clock signal inversion circuit 13 is connected with the first power supply wire 7 while the remaining latch circuits 11 and 12 are connected with the second power supply wire 8. The latch circuits 11 and 12 and the clock signal inversion circuit 13 are connected with the third power supply wire 9 in common.

Figure 3:
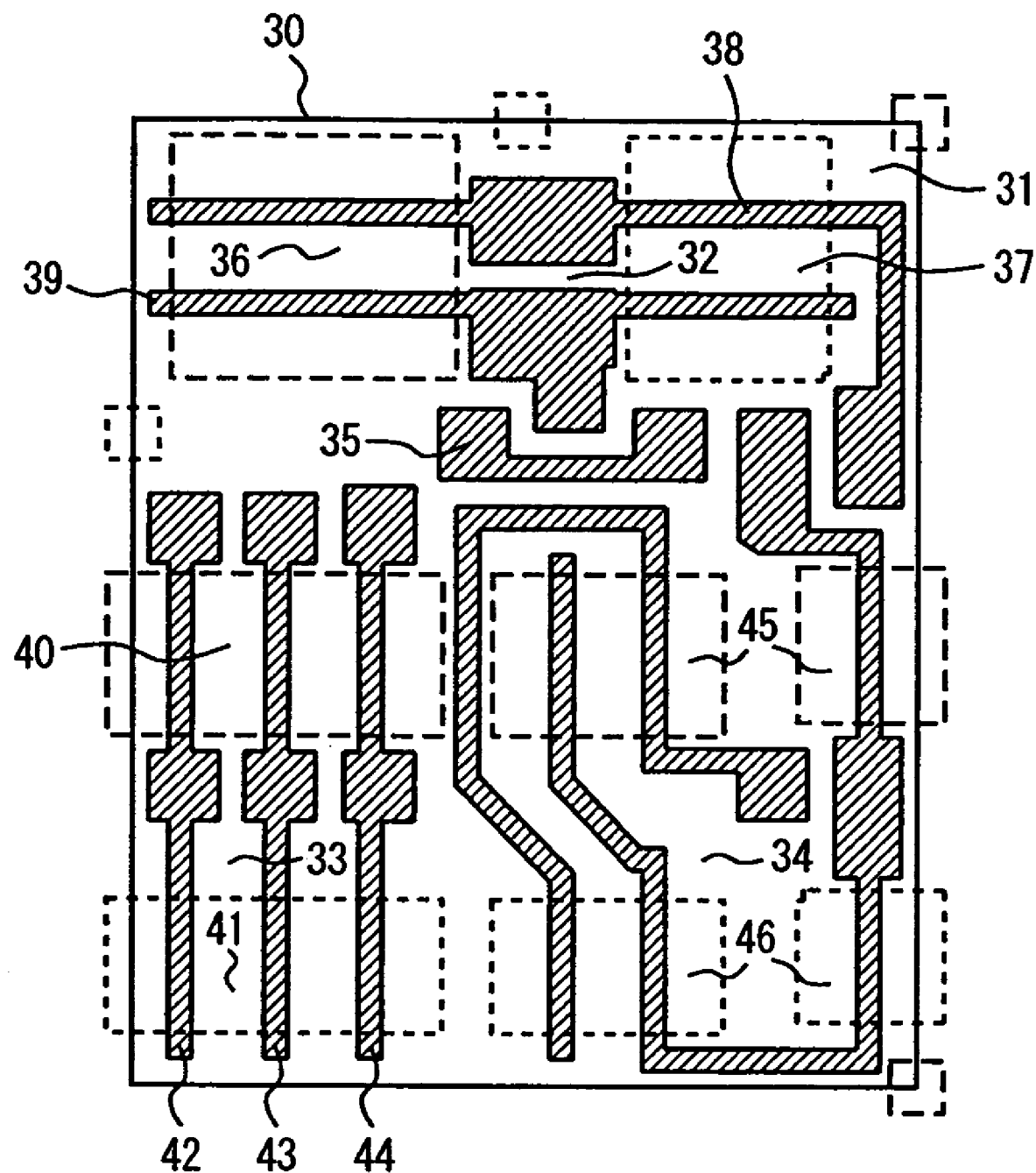
FIG. 3 is a plan view showing the structure of a gate array system basic cell in the first embodiment of the present invention.

The logic circuit 6 is designed with the gate array system (master slice system). FIG. 3 shows the structure of a gate array system basic cell 30 for forming the logic circuit 6.

The basic cell 30 is formed by a rectangular cell substrate 31, a first device region 32 occupying an upper area of about ⅓ of the cell substrate 31, a second device region 33 occupying a lower left area of about ¼ of the cell substrate 31, a third device region 34 occupying a lower right area of about ⅓ of the cell substrate 31 and a wiring pattern 35 provided in the clearance between the first and third device regions 32 and 34.

The first device region 32 is provided with a first P-type transistor group 36 and a first N-type transistor group 37, and P-type transistors forming the first P-type transistor group 36 and N-type transistors forming the first N-type transistor group 37 share a first gate electrode 38 or a second gate electrode 39 in one-to-one correspondence respectively.

The second device region 33 is provided with a second P-type transistor group 40 and a second N-type transistor group 41, and P-type transistors forming the second P-type transistor group 40 and N-type transistors forming the second N-type transistor group 41 share a third gate electrode 42, a fourth gate electrode 43 or a fifth gate electrode 44 in one-to-one correspondence respectively.

The third device region 34 is provided with a third P-type transistor group 45 and a third N-type transistor group 46.

In the basic cell 30 according to the first embodiment, the first, second and third P-type transistor groups 36, 40 and 45 provided on the cell substrate 31 are varied in size, and the first, second and third N-type transistor groups 37, 41 and 46 are also varied in size. More specifically, the first P-type transistor group 36 is set to the maximum size among the P-type transistor groups 36, 40 and 45, while the second and third P-type transistor groups 40 and 45 are set to the same size. Among the N-type transistor groups 37, 41 and 46, the first N-type transistor group 37 is set to the maximum size, while the second and third N-type transistor groups 41 and 46 are set to the same size.

Such basic cells 30 are arranged on the semiconductor substrate in the form of a matrix. At this time, adjacent ones of the basic cells 30 are mirror-arranged.

Figure 4:
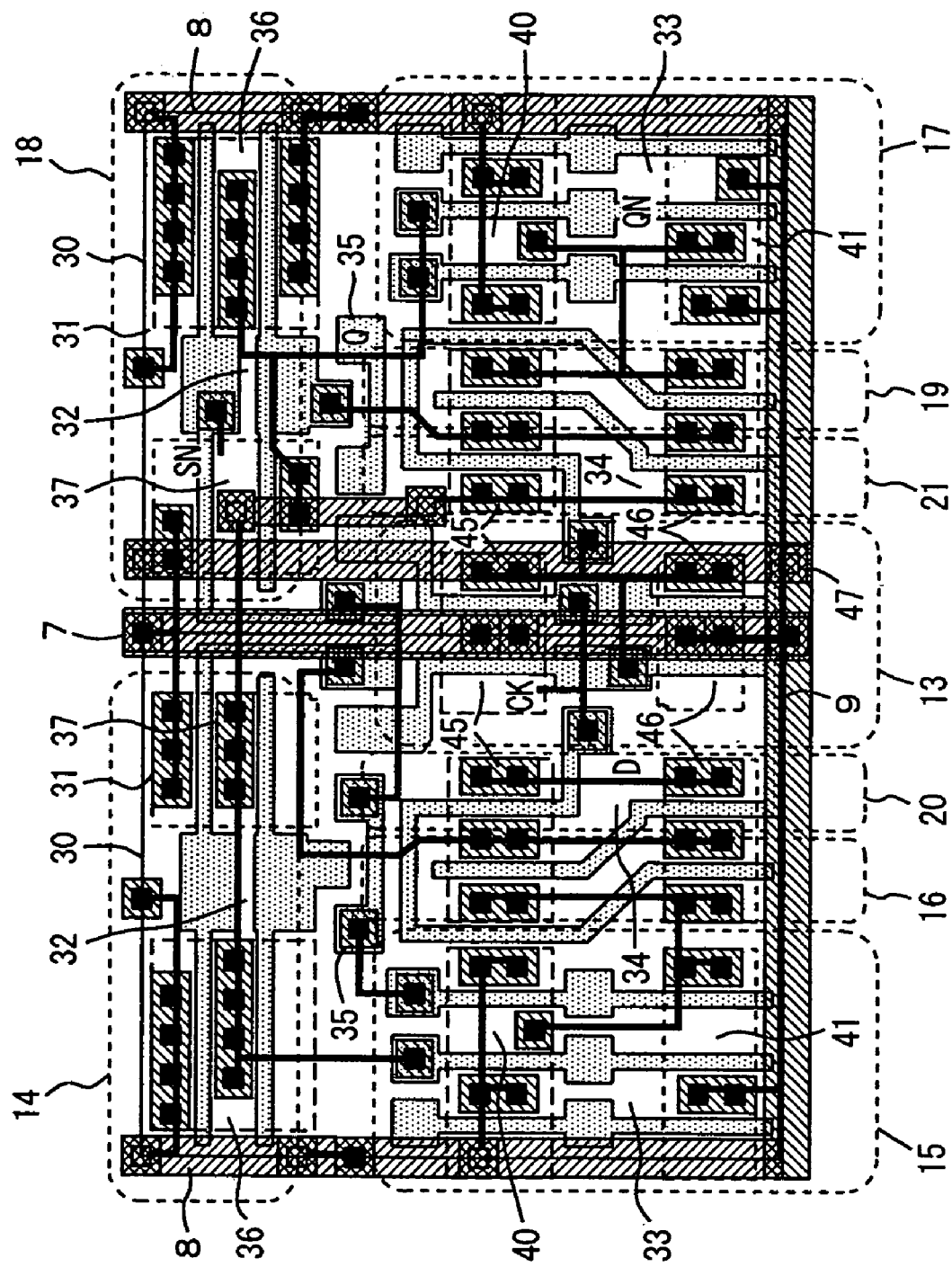
FIG. 4 is an actual circuit diagram of a delayed flip-flop circuit formed by the basic cells shown in FIG. 3.

FIG. 4 is an actual circuit diagram of the logic circuit 6 shown in FIG. 2 formed by the basic cells 30 shown in FIG. 3. Referring to FIG. 4, thick solid lines show wires connecting the transistors, for facilitating easy understanding. The wires connecting the transistors are formed on a first one of metal wiring layers. Referring to FIG. 4, marks ■ show contact parts.

The inverter 14 and the NAND circuit 18 require large drivability for outputting the signals. The basic cells 30 are horizontally mirror-arranged so that the large-sized transistors of the first device regions 32 are selected for the inverter 14 and the NAND circuit 18 having large drivability, the small-sized transistors of the second and third device regions 33 and 35 are selected for the NAND circuit 15, the inverter 17, the transfer gates 16 and 19 to 21 and the clock signal inversion circuit 13 requiring smaller drivability than the inverter 14 and the NAND circuit 18, and the transistors are interconnected with each other to form the logic circuit 6. While the individual transistor forming each clock signal inversion circuit 13 has small drivability, a plurality of clock signal inversion circuits 13 simultaneously operate and hence a large current instantaneously flows to the first power supply wire 7.

The third power supply wire (VSS) 9 is provided along the lower end portions of the cell substrates 31 to extend in the horizontal direction of FIG. 4, the second power supply wires (VDD) 8 are provided on both edges of the mirror-arranged cell substrates 31 to extend in the vertical direction of FIG. 4, and the first power supply wire (VDD) 7 is provided on the central portion between the mirror-arranged cell substrate 31 to extend in the vertical direction of FIG. 4. The third power supply wire 9 is provided on the first one of the metal wiring layers, while the second power supply wires 8 and the first power supply wire 7 are provided on the second one of the metal wiring layers. The first power supply wire 7 has a width (thickness) of about 1.4 times that of the second power supply wires 8. The right basic cell 30 is provided on its side end portion with a vertical wire 47 formed on the second one of the metal wiring layers to extend in the vertical direction of FIG. 4, and this vertical wire 47 is connected with the third power supply wire 9 provided on the first metal wiring layer.

The semiconductor integrated circuit 1 according to the first embodiment can attain the following functions/effects:

(1) In each logic circuit 6, only the clock signal inversion circuit 13 is connected with the first power supply wire 7 while the remaining latch circuits 11 and 12 are connected with the second power supply wire 8. The clock signals CK input in the plurality of clock signal inversion circuits 13 simultaneously change and hence a large current instantaneously flows to load capacitances of the clock signal inversion circuits 13. Also when a large voltage drop is developed in the first power supply wire 7 in this case, no bad influence thereof is exerted to the second power supply wire 8 but data signals processed in the latch circuits 11 and 12 can be prevented from noise, waveform rounding or delay degradation so that malfunctions can be prevented. The first and second input terminals 2 and 3 formed by the bonding pad serve as the sources for the power supply voltage VDD. In the first and second input terminals 2 and 3, therefore, wiring resistance causing voltage drops can be ignored.

(2) The third power supply wire 9 is provided on the first one of the metal wiring layers while the second power supply wire 8 and the first power supply wire 7 are provided on the second one of the metal wiring layers, thereby improving the degree of freedom in connection for the power supply wires 7, 8 and 9.

(3) While the width of the second power supply wire 8 is preferably set to the minimum necessary level in consideration of area reduction of the overall circuit, the width of the first power supply wire 7 instantaneously fed with a large current is rendered larger than that of the second power supply wire 8. Consequently, wiring resistance of the first power supply wire 7 is so reduced that the value of a voltage drop can be further reduced.

(4) The first and second input terminals 2 and 3 are provided in common, whereby the number of external pins can be reduced.

(Second Embodiment)

A second embodiment of the present invention is described with reference to FIGS. 5 and 6. Elements of the second embodiment similar to those of the first embodiment are denoted by the same reference numerals, and redundant description is not repeated.

Figure 5:
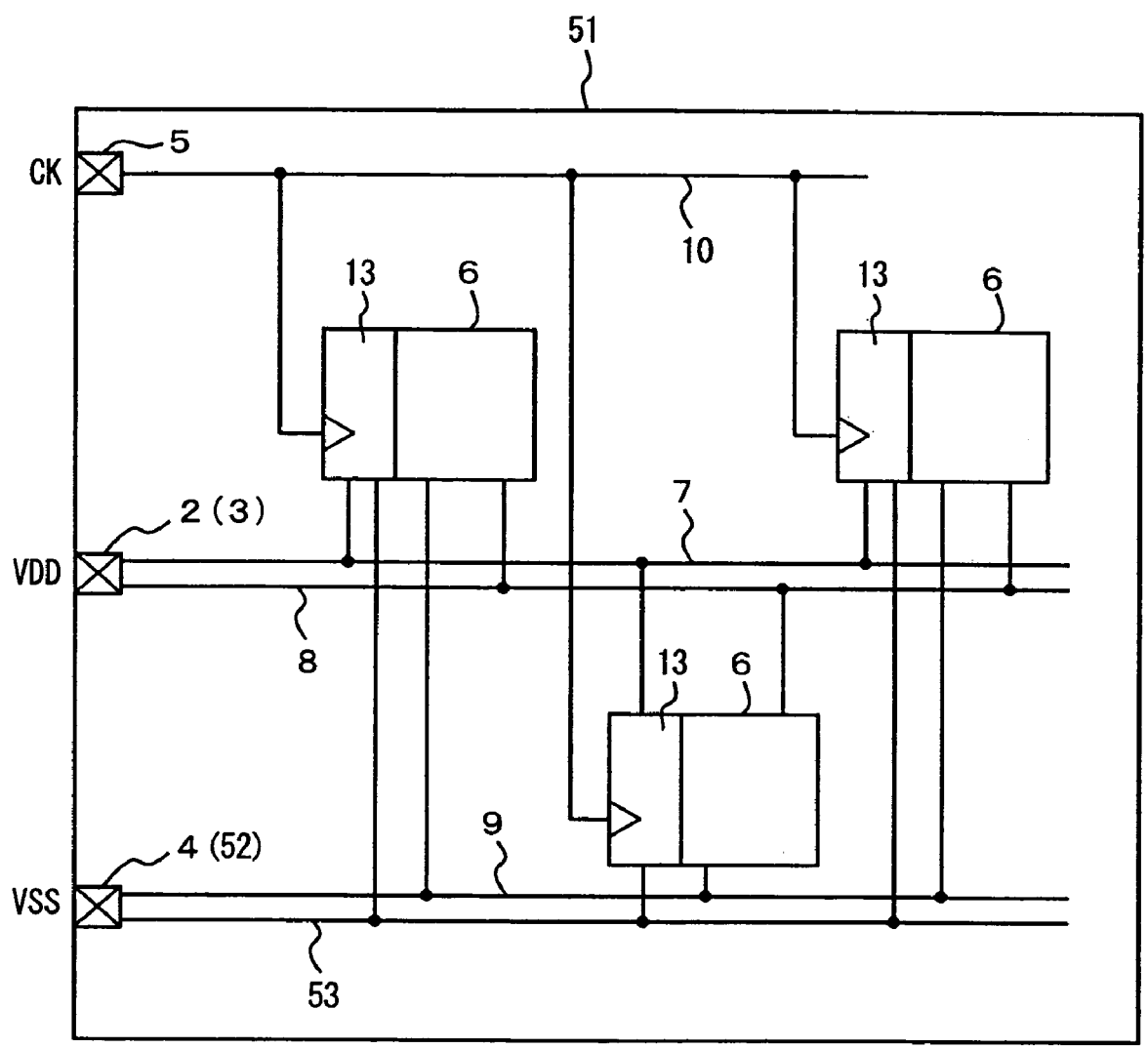
FIG. 5 is a block diagram of a semiconductor integrated circuit according to a second embodiment of the present invention.
Figure 6:
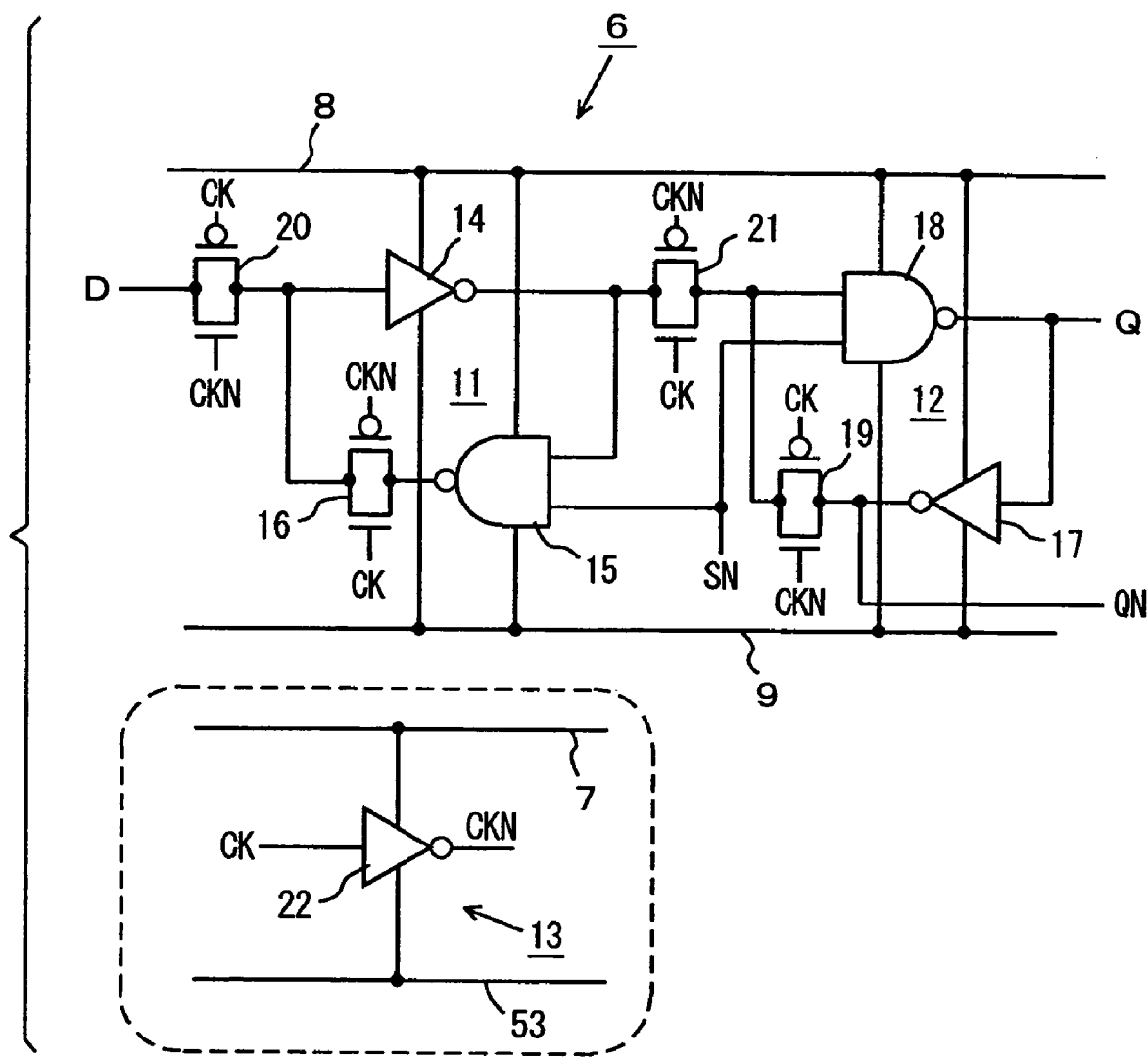
FIG. 6 is a detailed circuit diagram of a logic circuit part in the semiconductor integrated circuit according to the second embodiment of the present invention.

FIG. 5 is a block circuit diagram schematically showing the overall structure of a semiconductor integrated circuit 51 according to the second embodiment, and FIG. 6 is a detailed circuit diagram of a principal part thereof. The semiconductor integrated circuit 51 according to the second embodiment is different from the semiconductor integrated circuit 1 according to the first embodiment in a point that a fourth input terminal 52 for inputting a power supply voltage VSS from an external power source and a fourth power supply wire 53 for supplying the power supply voltage VSS to each logic circuit 6 from the fourth input terminal 52 are newly added. While the fourth power supply wire 53 has the same width (thickness) as a third power supply wire 9, the width of the former may alternatively be rendered larger than the width of the latter, similarly to the first embodiment. According to the second embodiment, a third input terminal 4 and the fourth input terminal 52 are provided in common.

In the logic circuit 6, only a clock signal inversion circuit 13 is connected with a first power supply wire 7 and the fourth power supply wire 53, while latch circuits 11 and 12 are connected with second and third power supply wires 8 and 9.

In addition to those of the first embodiment, the second embodiment can attain the following functions/effects:

(5) The fourth power supply wire 53 for inputting the power supply voltage VSS is provided independently of the third power supply wire 9 and connected with only the clock signal inversion circuit 13, whereby the fourth power supply wire 53 can be prevented from exerting bad influence resulting from power fluctuation to the latch circuits 11 and 12 and the latch circuits 11 and 12 can be more strongly prevented from malfunctions.

(6) The third and fourth input terminals 4 and 52 are provided in common, whereby the number of external pins can be reduced.

(Third Embodiment)

A third embodiment of the present invention is described with reference to FIG. 7. A semiconductor integrated circuit according to the third embodiment is different from the semiconductor integrated circuit 51 according to the second embodiment only in a point that each logic circuit 6 is designed in the standard cell system, and the remaining structure of the former is identical to that of the latter.

FIG. 7 is an actual circuit diagram of the logic circuit 6, similar to the logic circuit 6 shown in FIG. 2, formed by the standard cell system. A first power supply wire 7 and a second power supply wire 8 are arranged on an upper edge portion of a cell substrate 61, while a third power supply wire 9 and a fourth power supply wire 53 are arranged on a lower edge potion. All of the first power supply wire 7, the fourth power supply wire 53, the second power supply wire 8 and the third power supply wire 9 are provided on a first one of metal wiring layers.

This embodiment may be modified in the following ways, for attaining similar functions/effects:

(1) First and second input terminals 2 and 3 for inputting a power supply voltage VDD from an external power source are provided not in common but independently of each other. Thus, voltage drop resistance can be further improved.

(2) Third and fourth input terminals 4 and 52 for inputting a power supply voltage VSS from an external power source are provided not in common but independently of each other. Thus, voltage drop resistance can be further improved.

(3) A clock signal amplification circuit or a clock signal control circuit is employed as a circuit necessary operating due to transition of a clock signal CK in place of a clock signal inversion circuit 13.

(4) A latch circuit is employed in place of a DFF circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated device comprising:
   a semiconductor substrate;
   a plurality of logic circuits formed on said semiconductor substrate and each including a first circuit for inputting a clock signal and a second circuit operating in synchronization with said clock signal input by said first circuit;
   an input terminal formed on said semiconductor substrate and receiving an externally supplied power supply voltage;
   a first power supply wire formed on said semiconductor substrate and connected between said input terminal and said first circuit of each of said plurality of said logic circuits; and
   a second power supply wire formed on said semiconductor substrate independently of said first power supply wire and connected between said input terminal and said second circuit of each of said plurality of said logic circuits.

2. The semiconductor integrated circuit according to claim 1, wherein
   said power supply voltage includes a high-potential side power supply voltage,
   said input terminal includes a high-potential side pad electrode receiving said high-potential side power supply voltage,
   said first power supply wire includes a first high-potential side power supply wire for supplying said high-potential side power supply voltage at said high-potential side pad electrode to said first circuit of each of said plurality of said logic circuits, and
   said second power supply wire includes a second high-potential side power supply wire for supplying said high-potential side power supply voltage at said high-potential side pad electrode to said second circuit of each of said plurality of said logic circuits.

3. The semiconductor integrated circuit according to claim 2, further comprising:
   a low-potential side pad electrode formed on said semiconductor substrate and receiving an externally supplied low-potential side power supply voltage; and
   a low-potential side power supply wire formed on said semiconductor substrate for supplying said low-potential side power supply voltage at said low-potential side pad electrode to said first circuit and said second circuit of each of said plurality of said logic circuits.

4. The semiconductor integrated circuit according to claim 3, wherein
   said low-potential side power supply wire includes
   a first low-potential side power supply wire for supplying said low-potential side power supply voltage at said low-potential side pad electrode to first circuit of each of said plurality of said logic circuits, and
   a second low-potential side power supply wire for supplying said low-potential side power supply voltage at said low-potential side pad electrode to said second circuit of each of said plurality of said logic circuits.

5. The semiconductor integrated circuit according to claim 3, wherein
   said low-potential side pad electrode includes
   a first low-potential side pad electrode formed on said semiconductor substrate and receiving said low-potential side power supply voltage and
   a second low-potential side pad electrode formed on said semiconductor substrate and receiving said low-potential side power supply voltage,
   said low-potential side power supply wire includes
   a first low-potential side power supply wire for supplying said low-potential side power supply voltage at said first low-potential side pad electrode to said first circuit of each of said plurality of said logic circuits, and
   a second low-potential side power supply wire for supplying said low-potential side power supply voltage at said second low-potential side pad electrode to said second circuit of each of said plurality of said logic circuits.

6. The semiconductor integrated circuit according to claim 1, wherein
   said second circuit includes a holding circuit holding the state of an input signal in response to said clock signal input by said first circuit.

7. The semiconductor integrated circuit according to claim 1, wherein
   said logic circuit is formed by a basic cell of a standard cell system or a gate array system.

8. A semiconductor integrated device comprising:
   a semiconductor substrate;
   a plurality of logic circuits formed on said semiconductor substrate and each including a first circuit for inputting a clock signal and a second circuit operating in synchronization with said clock signal input by said first circuit;
   a first input terminal formed on said semiconductor substrate and receiving an externally supplied power supply voltage;
   a second input terminal formed on said semiconductor substrate and receiving said externally supplied power supply voltage;
   a first power supply wire formed on said semiconductor substrate and connected between said first input terminal and said first circuit of each of said plurality of said logic circuits; and
   a second power supply wire formed on said semiconductor substrate independently of said first power supply wire and connected between said second input terminal and said second circuit of each of said plurality of said logic circuits.

9. The semiconductor integrated circuit according to claim 8, wherein
   said power supply voltage includes a high-potential side power supply voltage,
   said first input terminal includes a first high-potential side pad electrode receiving said high-potential side power supply voltage,
   said second input terminal includes a second high-potential side pad electrode receiving said high-potential side power supply voltage,
   said first power supply wire includes a first high-potential side power supply wire for supplying said high-potential side power supply voltage at said first high-potential side pad electrode to said first circuit of each of said plurality of said logic circuits, and said second power supply wire includes a second high-potential side power supply wire for supplying said high-potential side power supply voltage at said second high-potential side pad electrode to said second circuit of each of said plurality of said logic circuits.

10. The semiconductor integrated circuit according to claim 9, further comprising:

a low-potential side pad electrode formed on said semiconductor substrate and receiving an externally supplied low-potential side power supply voltage; and a low-potential side power supply wire formed on said semiconductor substrate for supplying said low-potential side power supply voltage at said low-potential side pad electrode to said first circuit and said second circuit of each of said plurality of said logic circuits.

11. The semiconductor integrated circuit according to claim 10, wherein said low-potential side power supply wire includes a first low-potential side power supply wire for supplying said low-potential side power supply voltage at said low-potential side pad electrode to said first circuit of each of said plurality of said logic circuits, and a second low-potential side power supply wire for supplying said low-potential side power supply voltage at said low-potential side pad electrode to said second circuit of each of said plurality of said logic circuits.

12. The semiconductor integrated circuit according to claim 10, wherein said low-potential side pad electrode includes a first low-potential side pad electrode formed on said semiconductor substrate and receiving said low-potential side power supply voltage and a second low-potential side pad electrode formed on said semiconductor substrate and receiving said low-potential side power supply voltage, said low-potential side power supply wire includes a first low-potential side power supply wire for supplying said low-potential side power supply voltage at said first low-potential side pad electrode to said first circuit of each of said plurality of said logic circuits, and a second low-potential side power supply wire for supplyng said low-potential side power supply voltage at said second low-potential side pad electrode to said second circuit of each of said plurality of said logic circuits.

13. The semiconductor integrated circuit according to claim 8, wherein said second circuit includes a holding circuit holding the state of an input signal in response to said clock signal input by said first circuit.

14. The semiconductor integrated circuit according to claim 8, wherein said logic circuit is formed by a basic cell of a standard cell system or a gate array system.

* * * * *